United States Patent
Matsubara

(10) Patent No.: US 10,679,114 B2
(45) Date of Patent: Jun. 9, 2020

(54) RADIO-FREQUENCY FRONT END CIRCUIT, HIGH-FREQUENCY SIGNAL PROCESSING CIRCUIT, AND COMMUNICATION DEVICE

(71) Applicant: Murata Manufacturing Co., Ltd., Nagaokakyo-shi, Kyoto-fu (JP)

(72) Inventor: Hiroshi Matsubara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/362,734

(22) Filed: Mar. 25, 2019

(65) Prior Publication Data
US 2019/0220722 A1 Jul. 18, 2019

Related U.S. Application Data

(63) Continuation of application No. PCT/JP2017/034608, filed on Sep. 26, 2017.

(30) Foreign Application Priority Data

Sep. 30, 2016 (JP) .................................. 2016-192501

(51) Int. Cl.
| | |
|---|---|
| *G06K 19/077* | (2006.01) |
| *H03H 9/64* | (2006.01) |
| *H04B 1/401* | (2015.01) |
| *H03H 9/54* | (2006.01) |
| *H04B 1/00* | (2006.01) |
| *H04B 1/18* | (2006.01) |
| *H03H 9/72* | (2006.01) |

(Continued)

(52) U.S. Cl.
CPC ... *G06K 19/0775* (2013.01); *G06K 19/07786* (2013.01); *H03H 7/46* (2013.01); *H03H 9/547* (2013.01); *H03H 9/64* (2013.01); *H03H 9/72* (2013.01); *H04B 1/00* (2013.01); *H04B 1/006* (2013.01); *H04B 1/18* (2013.01); *H04B 1/401* (2013.01); *H04B 1/52* (2013.01)

(58) Field of Classification Search
CPC ...................... G06K 19/0775; G06K 19/07786
See application file for complete search history.

(56) References Cited

U.S. PATENT DOCUMENTS

2005/0281210 A1  12/2005  Makino

FOREIGN PATENT DOCUMENTS

| JP | 2002-171193 A | 6/2002 |
| JP | 2003-008383 A | 1/2003 |
| JP | 2005-184773 A | 7/2005 |

(Continued)

OTHER PUBLICATIONS

Official Communication issued in International Patent Application No. PCT/JP2017/034608, dated Dec. 19, 2017.

*Primary Examiner* — Tuan H Nguyen
(74) *Attorney, Agent, or Firm* — Keating & Bennett, LLP

(57) ABSTRACT

A radio-frequency front end circuit includes an input terminal, output terminals, a first filter, a third filter, and a matching inductor. The first filter is connected between the input terminal and the output terminal and allows a first communication signal in a low band to pass. The first filter is defined by an elastic wave filter. The third filter is connected between the input terminal and the output terminal and allows a third communication signal in a high band to pass. The third filter is defined by a high pass filter including an inductor and capacitors. The matching inductor is connected between the filter and the input terminal.

15 Claims, 4 Drawing Sheets

(51) Int. Cl.
*H04B 1/52* (2015.01)
*H03H 7/46* (2006.01)

(56) References Cited

FOREIGN PATENT DOCUMENTS

| | | |
|---|---|---|
| JP | 2013-098785 A | 5/2013 |
| JP | 2015-154434 A | 8/2015 |

RADIO-FREQUENCY FRONT END CIRCUIT, HIGH-FREQUENCY SIGNAL PROCESSING CIRCUIT, AND COMMUNICATION DEVICE

CROSS REFERENCE TO RELATED APPLICATIONS

This application claims the benefit of priority to Japanese Patent Application No. 2016-192501 filed on Sep. 30, 2016 and is a Continuation Application of PCT Application No. PCT/JP2017/034608 filed on Sep. 26, 2017. The entire contents of each of these applications are hereby incorporated herein by reference.

BACKGROUND OF THE INVENTION

1. Field of the Invention

The present invention relates to a radio-frequency front end circuit for high frequency signals in a plurality of communication bands for communication using an antenna common to the communication bands.

2. Description of the Related Art

Japanese Unexamined Patent Application Publication No. 2013-98785 describes a branch circuit that demultiplexes high frequency signals in three communication bands. The branch circuit described in Japanese Unexamined Patent Application Publication No. 2013-98785 includes filters for the respective communication bands. A first filter is connected between an input terminal and a first output terminal, a second filter is connected between the input terminal and a second output terminal, and a third filter is connected between the input terminal and a third output terminal. The first filter, the second filter, and the third filter are each formed using a SAW filter.

Common connection is performed on capacitors on the input side of the first filter and the input side of the second filter, respectively. A first matching circuit is connected between the connecting point of each filter and the input terminal. The first matching circuit includes a plurality of inductors and capacitors.

A second matching circuit is connected between the third filter and the input terminal. The second matching circuit includes a plurality of capacitors and an inductor.

However, the configuration in Japanese Unexamined Patent Application Publication No. 2013-98785 needs to include a large number of circuit elements, such as the inductors and the capacitors, to ensure the impedance matching of the first and second filters and the third filter and the isolation between the first and second filters side and the third filter side. Accordingly, it is difficult to downsize a radio-frequency front end circuit, and loss is increased in accordance with the number of circuit elements.

SUMMARY OF THE INVENTION

Preferred embodiments of the present invention provide radio-frequency front end circuits that are small, that have a simple configuration, and that reduce or prevent insertion loss.

A radio-frequency front end circuit according to a preferred embodiment of the present invention includes an input terminal, a first output terminal, a third output terminal, a first filter, a third filter, and a second inductor. The first filter is connected between the input terminal and the first output terminal and allows a first communication signal to pass. The first filter is defined by an elastic wave filter. The third filter is connected between the input terminal and the third output terminal and allows a third communication signal to pass, the third communication signal being assigned, as a pass band, a frequency band higher than a pass band for the first communication signal. The third filter is a high pass filter including a first inductor and a capacitor. The second inductor is connected between the first filter and the input terminal.

With this configuration, the number of elastic wave filters is smaller than the number of communication bands, and a matching circuit is simplified.

A radio-frequency front end circuit according to a preferred embodiment of the present invention may have the following configuration. The radio-frequency front end circuit further includes a second output terminal and a second filter. The second filter is connected between the input terminal and the second output terminal. The second filter allows a second communication signal to pass, the second communication signal being assigned, as a pass band, a frequency band that is different from the pass band for the first communication signal and that is lower than the pass band for the third communication signal. The second filter is defined by an elastic wave filter. The second inductor is connected between a point of connection between the first filter and the second filter and the input terminal.

This configuration illustrates a case including three output terminals and three filters. Also in this case, the number of elastic wave filters is smaller than the number of communication bands, and the matching circuit is simplified.

A radio-frequency front end circuit according to a preferred embodiment of the present invention preferably has the following configuration. The radio-frequency front end circuit includes a multilayer body in which a predetermined conductor pattern is provided. The first filter, the second filter, at least a portion of the first inductor included in the third filter, and at least a portion of the capacitor included in the third filter are respectively mounted electronic components mounted on the multilayer body. The matching inductor is defined by a mounted electronic component, a conductor pattern provided in the multilayer body, or both of the mounted electronic component and the conductor pattern.

With this configuration, the second inductor is able to be provided appropriately, depending on the shape of the radio-frequency front end circuit. For example, in a case in which a portion of the second inductor is provided inside the multilayer body, the size of the mounted electronic component is smaller than in a case in which the mounted electronic component defines the entire second inductor.

In addition, in a radio-frequency front end circuit according to a preferred embodiment of the present invention, the conductor pattern used for the second inductor is preferably capacitively coupled to a ground conductor provided inside the multilayer body.

With this configuration, a low pass filter including the matching inductor and a capacitor based on the capacitive coupling is provided. The low pass filter has characteristics leading to high attenuation in a frequency higher than a pass band for a communication signal in the low band. Accordingly, a circuit on the low band side and a circuit on the high band side are highly isolated from each other, and filter characteristics on the high band side are improved. In addition, since capacitors for low pass filters are not individually provided, the radio-frequency front end circuit has a simpler configuration.

A radio-frequency front end circuit according to a preferred embodiment of the present invention may also have the following configuration. The mounted electronic components are mounted on a surface of the multilayer body. A shield conductor is disposed on the surface of the multilayer body. The shield conductor covers at least the mounted electronic component included in the second inductor and is connected to the ground conductor. The mounted electronic component included in the second inductor and the shield conductor are capacitively coupled.

With this configuration, the capacitance of the capacitor connected to the second inductor is increased while preventing high-frequency coupling between the radio-frequency front end circuit and an outside component (such as an external circuit). In other words, the size of the capacitive coupling portion to obtain a desired capacitor is able to be reduced.

In addition, a high-frequency signal processing circuit according to a preferred embodiment of the present invention includes a radio-frequency front end circuit according to a preferred embodiment of the present invention, a switching circuit that performs selection on a plurality of output terminals that at least include the first output terminal and the third output terminal, and an amplifier connected to the switching circuit.

In this configuration, a small high-frequency processing circuit having a simple circuit configuration is provided.

In addition, a communication device according to a preferred embodiment of the present invention includes a high-frequency signal processing circuit according to a preferred embodiment of the present invention and a RFIC connected to the high-frequency signal processing circuit.

In this configuration, a small communication device having a simple circuit configuration is provided.

According to preferred embodiments of the present invention, radio-frequency front end circuits that each have a simple configuration, that are small, and that reduce or prevent insertion loss are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

Figure 1:
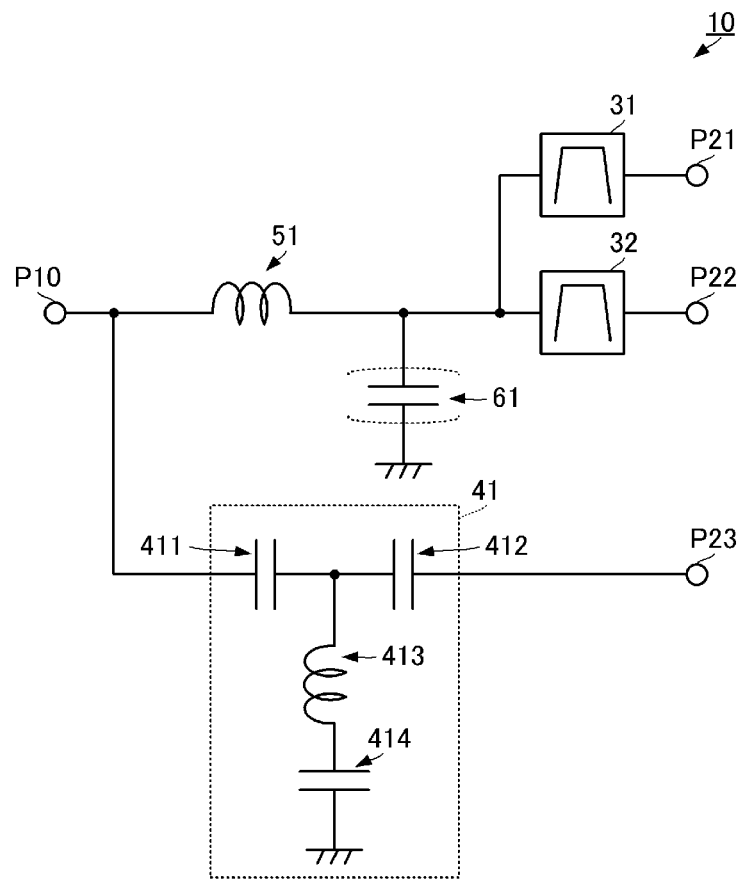
FIG. 1 is a circuit diagram of a radio-frequency front end circuit according to a preferred embodiment of the present invention.

A radio-frequency front end circuit according to a first preferred embodiment of the present invention will be described with reference to the drawings. FIG. 1 is a circuit diagram of a radio-frequency front end circuit according to a preferred embodiment of the present invention.

Note that a low band and a high band are set based on how high or low frequencies are relative to the other frequencies in the present preferred embodiment. For example, in a radio-frequency front end circuit 10 in the present preferred embodiment, preferably, frequencies from about 1.5 to about 1.8 GHz are set as frequencies in the low band, and frequencies of about 2.0 GHz or higher is set as frequencies in the high band, for example. The settings of the low band and the high band are not limited to these settings and may be appropriately performed, depending on a communication system in which the radio-frequency front end circuit 10 is provided.

As illustrated in FIG. 1, the radio-frequency front end circuit 10 includes an input terminal P10 and output terminals P21, P22, and P23. The output terminal P21 corresponds to a "first output terminal", the output terminal P22 corresponds to a "second output terminal", and the output terminal P23 corresponds to a "third output terminal".

The radio-frequency front end circuit 10 includes a filter 31, a filter 32, a filter 41, and a matching inductor 51. The radio-frequency front end circuit 10 also includes a capacitor 61 defined by parasitic capacitance. The filter 31 corresponds to a "first filter", the filter 32 corresponds to a "second filter", and the filter 41 corresponds to a "third filter".

The filter 31 is preferably a band pass filter. A frequency band of a first communication signal in the low band is set in a pass band of the filter 31, the first communication signal being assigned, as a pass band, a frequency band that is different from a pass band of a second communication signal and that is lower than a pass band of a third communication signal. Further, in the settings for the filter 31, the frequency bands of the second communication signal and the third communication signal are within an attenuation band.

The filter 32 is preferably a band pass filter. A frequency band of the second communication signal in the low band is set in a pass band of the filter 32, the second communication signal being assigned, as a pass band, a frequency band that is different from the pass band of the first communication signal and that is lower than the pass band of the third communication signal. Further, in the settings for the filter 32, the frequency bands of the first communication signal and the third communication signal are in an attenuation band.

The filter 41 is preferably a high frequency pass filter. The frequency band of the third communication signal in the high band is set in a pass band of the filter 41. Further, in the settings for the filter 41, the frequency bands of the first communication signal and the second communication signal are in an attenuation band.

The filter 31 and the filter 32 are preferably defined by elastic wave filters, specifically, for example, SAW filters.

The filter 31 is connected between the input terminal P10 and the output terminal P21. The filter 32 is connected between the input terminal P10 and the output terminal P22.

The elastic wave filter may be a SAW (surface acoustic wave) filter or a BAW (bulk acoustic wave) filter, for example. A SAW filter includes a substrate and an IDT (interdigital transducer) electrode. The substrate includes at least a surface of which that has piezoelectricity. For example, the substrate may be a multilayer body including a piezoelectric thin film as a surface thereof, a film having an acoustic velocity different from that of the piezoelectric thin film, a supporting substrate, and other suitable films or layers. The substrate may have piezoelectricity on the entire substrate. In this case, the substrate is preferably a piezoelectric substrate including one piezoelectric layer, for example.

The matching inductor 51 is connected between the input terminal P10 and the connection point between the filter 31 and the filter 32. The capacitor 61 is connected between a ground and an end portion of the matching inductor 51 on a side closer to the filters 31 and 32. The matching inductor 51 and the capacitor 61 are included in a matching circuit on the low band side. The matching circuit on the low band side defines and functions as a low pass filter.

The filter 41 is connected between the input terminal P10 and the output terminal P23. More specifically, one end of the filter 41 is connected to a line connecting the input terminal P10 and the matching inductor 51. The other end of the filter 41 is connected to the output terminal P23.

The filter 41 includes capacitors 411, 412, and 414 and an inductor 413. The capacitor 411 and the capacitor 412 are connected in series between the input terminal P10 and the output terminal P23. The inductor 413 and the capacitor 414 are connected in series between a ground and the point of connection between the capacitor 411 and the capacitor 412. More specifically, one end of the inductor 413 is connected to the connection point between the capacitor 411 and the capacitor 412. The other end of the inductor 413 is connected to one end of the capacitor 414, and the other end of the capacitor 414 is connected to the ground. As described above, the filter 41 is defined by an LC filter and is the high frequency pass filter (high pass filter). As described above, the filter 41 allows the third communication signal to pass, attenuates the first communication signal and the second communication signal, and is set to have high impedance for the low pass band.

With the above-described circuit configuration, the radio-frequency front end circuit 10 filters the first communication signal, the second communication signal, and the third communication signal in the following manners, respectively.

After being input into the input terminal P10, the first communication signal is transmitted with low loss through the matching circuit on the low band side including the matching inductor 51 and the capacitor 61, is filtered by the filter 31, and is output from the output terminal P21. At this time, the filter 41 has impedance close to that in an open state in the frequency of the first communication signal, and thus the first communication signal is not transmitted to the output terminal P23 side. Accordingly, the first communication signal is transmitted with low loss from the input terminal P10 to the output terminal P21.

After being input into the input terminal P10, the second communication signal is transmitted with low loss through the matching circuit on the low band side including the matching inductor 51 and the capacitor 61, is filtered by the filter 32, and is output from the output terminal P22. At this time, the filter 41 has impedance close to that in an open state in the frequency of the second communication signal, and thus the second communication signal is not transmitted to the output terminal P23 side. Accordingly, the second communication signal is transmitted with low loss from the input terminal P10 to the output terminal P22.

After being input into the input terminal P10, the third communication signal is filtered by the filter 41 and output from the output terminal P23. At this time, the matching circuit on the low band side including the matching inductor 51 and the capacitor 61 has impedance close to that in an open state in the frequency of the third communication signal, and thus the third communication signal is not transmitted to the filters 31 and 32 side. Accordingly, the third communication signal is transmitted with low loss from the input terminal P10 to the output terminal P23.

As described above, the radio-frequency front end circuit 10 of the present preferred embodiment is able to demultiplex the three types of communication signals in a simple circuit configuration and prevent the transmission loss of each communication signal. In addition, the simplicity of the circuit configuration enables the radio-frequency front end circuit 10 to be reduced in size.

In particular, the capacitor 61 enables the matching circuit on the low band side to use a frequency band leading to high attenuation of higher frequencies in the pass band than the other. Accordingly, if this frequency band is caused to at least partially coincide with or to be approximately the same as the frequency band of the third communication signal, the impedance for the third communication signal is able to be approximated to that in the open state more reliably. Accordingly, the transmission loss of the third communication signal is further reduced or prevented.

Although the following is not described regarding the related art, an inductor (shunt inductor) connected between a transmission line and a ground is generally used in the radio-frequency front end circuit in the related art to define the matching circuit on the low band side in a simple configuration. An inductor (series inductor) connected in series with a signal line is not provided. In a case in which a radio-frequency front end circuit is provided using a multilayer body, a parasitic capacitor having even a slight capacitance is generated between the signal line and the ground and defines and functions as the shunt capacitor. When filters on the low band side are defined only by elastic wave filters in a radio-frequency front end circuit including the filters on the low band side allowing a low band signal to pass and a filter on the high band side allowing a high band signal to pass, the following problem arises in some cases.

An elastic wave filter (particularly, a SAW filter) leads to a capacitive characteristic regarding a band other than the pass band for the filter, and the impedance is like that in a short circuit when viewed from the antenna common terminal side. That is, the filter on the low band side seems to be short circuited in the frequency band of a communication signal in the high band, and the communication signal leaks to a ground. Further, when the radio-frequency front end circuit is provided using the multilayer body, there is a problem of an increase in transmission loss of a communication signal in the high band because the communication signal leaks to a ground via a parasitic capacitance generated between a signal line and the ground. Note the use of an inductor (shunt inductor) connected between a transmission line and the ground does not enable the characteristic to be improved. If the radio-frequency front end circuit is provided using a multilayer body including dielectric layers as to be described later, parasitic capacitance of a ground conductor is not easily eliminated. Accordingly, the shunt capacitor is not easily eliminated.

However, since the radio-frequency front end circuit 10 of the present preferred embodiment includes the matching inductor 51 that is a series inductor, the leakage of the communication signal in the high band (third communication signal) to the ground due to the shunt capacitor is able to be reduced or prevented, and the above-described problem that arises when the shunt capacitor defined by the parasitic capacitance is provided is able to be solved. Further, in the radio-frequency front end circuit 10, the shunt capacitor defined by the parasitic capacitance is utilized to define the matching circuit on the low band side including the shunt inductor and the matching inductor 51, and thus isolation from the frequency band for the communication signal in the high band (third communication signal) is achieved to a higher degree. The shunt capacitor is defined by the parasitic capacitance, and thus the size of the radio-frequency front end circuit 10 is able to be smaller than that in the case in which the shunt capacitor is defined by a separately mounted electronic component.

Figure 2:
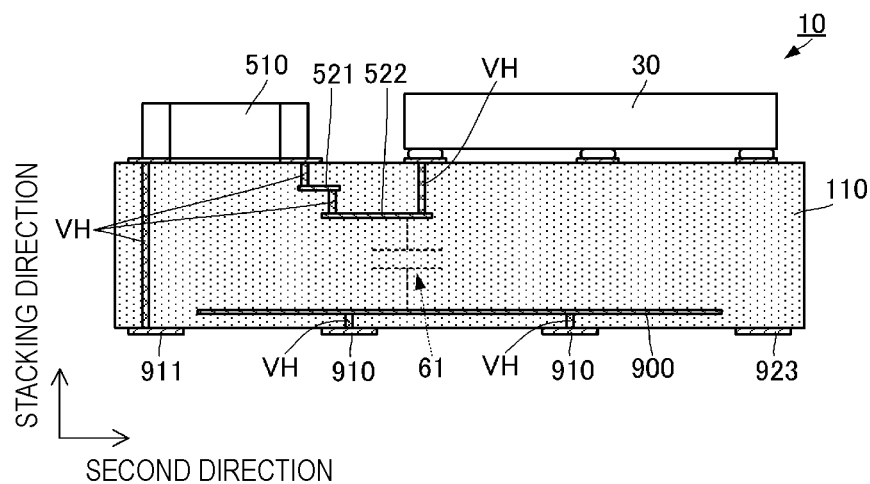
FIG. 2 is a cross-sectional side view illustrating the structure of a radio-frequency front end circuit according to a first preferred embodiment of the present invention.
Figure 3:
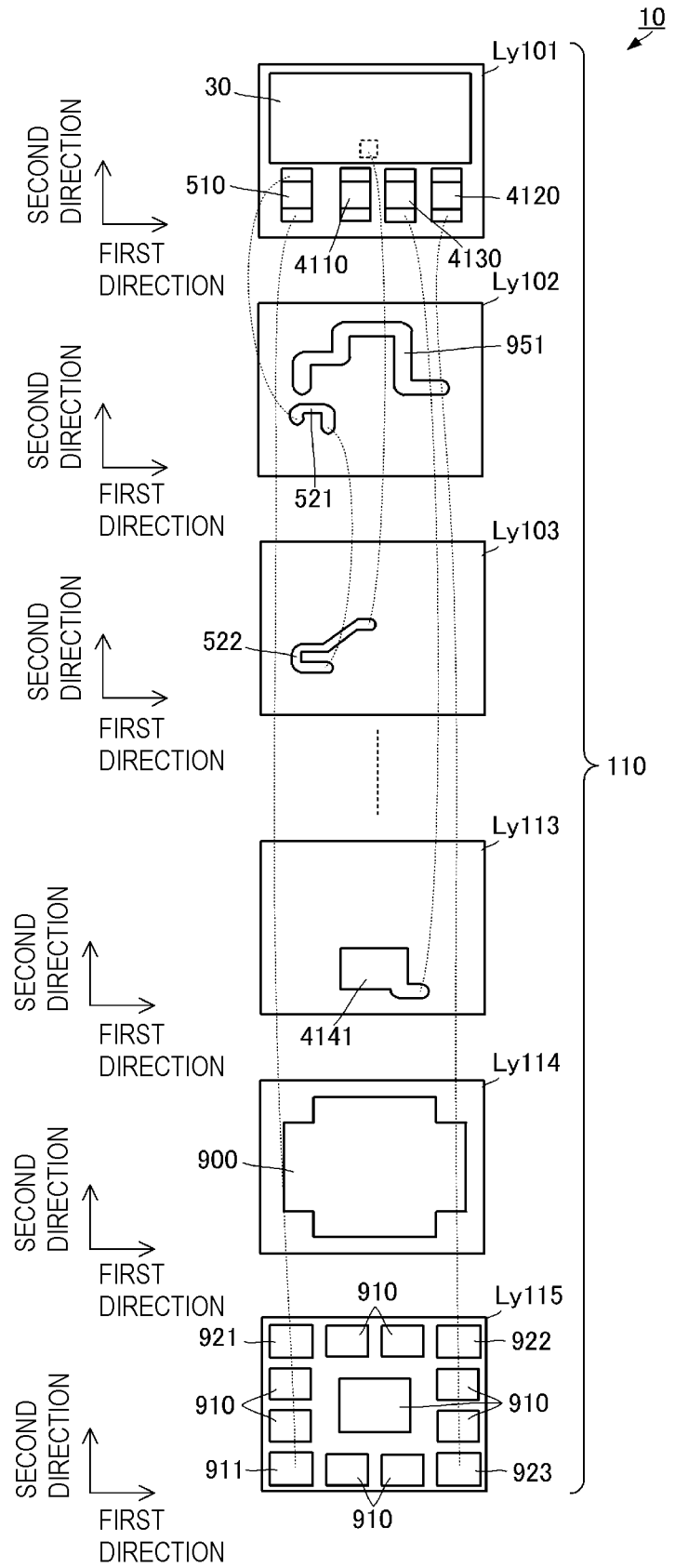
FIG. 3 is an exploded plan view of the radio-frequency front end circuit according to the first preferred embodiment of the present invention.

The radio-frequency front end circuit 10 described above includes the structure described below. FIG. 2 is a cross-sectional side view illustrating the structure of the radio-frequency front end circuit according to a first preferred embodiment of the present invention. In FIG. 2, to make clear the structural characteristics of the radio-frequency front end circuit 10, horizontal and vertical dimensions are appropriately adjusted, and the positional relationship among the circuit elements (such as mounted electronic components and conductor patterns) is also appropriately adjusted. FIG. 3 is an exploded plan view of the radio-frequency front end circuit according to the first preferred embodiment of the present invention. FIG. 3 illustrates the upper surfaces of the first layer to the 14th layer, respectively, and the lower surface of the 15th layer. FIG. 3 illustrates only portions having structural characteristics of the radio-frequency front end circuit 10, and illustration of a layer including only one or more via holes or other such structure provided therein is omitted.

As illustrated in FIGS. 2 and 3, the radio-frequency front end circuit 10 includes a multilayer body 110, a filter component 30, mounted inductors 510 and 4130, and mounted capacitors 4110 and 4120.

The multilayer body 110 includes dielectric layers Ly101 to Ly115 (illustration of dielectric layers Ly104 to Ly112 is omitted in FIG. 3). The dielectric layers Ly101 to Ly115 in a laminated state are disposed in this order from the upper surface of the multilayer body 110 toward the lower surface thereof. Note that the number of dielectric layers included in the multilayer body 110 is not limited to this and may be set appropriately.

Mounted land conductors for components are provided on the upper surface of the dielectric layer Ly101, that is, the upper surface of the multilayer body 110. The filter component 30, the mounted inductors 510 and 4130, and the mounted capacitors 4110 and 4120 are mounted on the upper surface of the multilayer body 110 using the respective mounted land conductors. The mounted inductors 510 and 4130 and the mounted capacitors 4110 and 4120 are disposed in a first direction orthogonal or substantially orthogonal to a stacking direction of the multilayer body 110. Specifically, the mounted inductor 510, the mounted capacitor 4110, the mounted inductor 4130, and the mounted capacitor 4120 are disposed in this order from one end in the first direction toward the other end. At this time, each of the mounted inductors 510 and 4130 and the mounted capacitors 4110 and 4120 is disposed such that corresponding external connection conductors are parallel or substantially parallel to each other in a second direction. The filter component 30 is disposed at a predetermined distance in the second direction from the group of the mounted inductors 510 and 4130 and the mounted capacitors 4110 and 4120.

An inductor conductor pattern 521 and a ground conductor pattern 951 are provided on the upper surface of the dielectric layer Ly102. The inductor conductor pattern 521 has a wound shape. A portion of and including one end of the inductor conductor pattern 521 overlaps with the mounted inductor 510 in a plan view of the multilayer body 110. The one end of the inductor conductor pattern 521 is connected to one of the external connection conductors of the mounted inductor 510 with an interlayer connection conductor VH disposed therebetween. The ground conductor pattern 951 overlaps with the filter component 30 in the plan view of the multilayer body 110.

An inductor conductor pattern 522 is provided on the upper surface of the dielectric layer Ly103. A portion of the inductor conductor pattern 522 has a wound shape. The entirety or substantially the entirety of the portion of the wound shape of the inductor conductor pattern 522 overlaps with the inductor conductor pattern 521 in the plan view of the multilayer body 110. One end of the inductor conductor pattern 522 is connected to the other end of the inductor conductor pattern 521 with an interlayer connection conductor VH disposed therebetween. The other end of the inductor conductor pattern 522 overlaps with the filter component 30 in the plan view of the multilayer body 110 and is connected to the filter component 30 with an interlayer connection conductor VH disposed therebetween. With the configuration as described above, an integrated inductor defined by conductor patterns inside the multilayer body 110 is provided by the inductor conductor pattern 521 and the inductor conductor pattern 522. The matching inductor 51 is defined by the integrated inductor and the mounted inductor 510.

A capacitor conductor 4141 is provided on the upper surface of the dielectric layer Ly113. The capacitor conductor 4141 preferably has a rectangular or substantially rectangular shape, for example. The capacitor conductor 4141 is connected to one of the external connection conductors of the mounted inductor 4130 with an interlayer connection conductor disposed therebetween.

A ground conductor 900 is provided on the upper surface of the dielectric layer Ly114. The ground conductor 900 is provided over the entire or substantially the entire dielectric layer Ly114 except the four corners. The ground conductor 900 overlaps with the capacitor conductor 4141 in the plan view of the multilayer body 110. Capacitive coupling is provided, and the capacitor 414 is defined by the capacitor conductor 4141, the ground conductor 900, and the dielectric layer Ly113 sandwiched therebetween.

The ground conductor 900 overlaps with the inductor conductor pattern 522 in the plan view of the multilayer body 110. With this configuration, the inductor conductor pattern 522 and the ground conductor 900 are capacitively coupled, and the capacitor 61 defined by the parasitic capacitance is provided.

The ground conductor 900 is also connected to the ground conductor pattern 951 with a plurality of interlayer connection conductors (not illustrated) disposed therebetween. The ground conductor pattern 951 and the inductor conductor pattern 521 are located close to each other on the same layer, and thus a portion of the capacitor 61 defined by the parasitic capacitance is provided.

External connection conductors 911, 921, 922, and 923 and a plurality of external connection conductors for grounding 910 are provided on the lower surface of the dielectric layer Ly115. The external connection conductor 911 defines and functions as the input terminal P10. The external connection conductor 921 defines and functions as the output terminal P21 that is the first output terminal, the external connection conductor 922 defines and functions as the output terminal P22 that is the second output terminal, and the external connection conductor 923 defines and functions as the output terminal P23 that is the third output terminal.

The external connection conductor 911 is disposed at the corner corresponding to one end, in the first direction, of the multilayer body 110 in the plan view of the multilayer body 110 and also corresponding to one end in the second direction. The external connection conductor 911 is connected to the other one of the external connection conductors of the mounted inductor 510 with an interlayer connection conductor VH disposed therebetween. The external connection conductor 923 is disposed at the corner corresponding to the other end, in the first direction, of the multilayer body 110 in the plan view and also corresponding to the one end in the second direction. The external connection conductor 923 is connected to one of the external connection conductors of the mounted capacitor 4120 with an interlayer connection conductor VH disposed therebetween. The external connection conductor 921 is disposed at the corner corresponding to the one end, in the first direction, of the multilayer body 110 in the plan view and also corresponding to the other end in the second direction. The external connection conductor 921 is connected to the filter 31 of the filter component 30 with a conductor pattern and an interlayer connection conductor (each of which is not illustrated) disposed therebetween. The external connection conductor 922 is disposed at the corner corresponding to the other end, in the first direction, of the multilayer body 110 in the plan view and also corresponding to the other end in the second direction. The external connection conductor 922 is connected to the filter 32 of the filter component 30 with the conductor pattern and an interlayer connection conductor (each of which is not illustrated) disposed therebetween.

As described above, the configuration in the present preferred embodiment enables the radio-frequency front end circuit 10 to be reduced in size in a simple configuration. In addition, in the radio-frequency front end circuit 10 of the present preferred embodiment, the inductor conductor pattern 522 close to the ground conductor 900 is longer than the inductor conductor pattern 521. This enables the parasitic capacitance to be increased and, thus, the capacitance of the capacitor 61 to be increased without increasing the size of the multilayer body 110.

Note that the capacitance of the capacitor 61 is able to be reduced to such a degree that it does not influence the characteristics of the radio-frequency front end circuit 10. In the configuration as described above, the isolation from the above-described high band side is slightly deteriorated. However, if the degree of reduction allows the demultiplexing characteristics required for the radio-frequency front end circuit 10 to be satisfied, the capacitor 61 may be omitted. This enables the circuit configuration of the radio-frequency front end circuit 10 to be further simplified.

Figure 4:
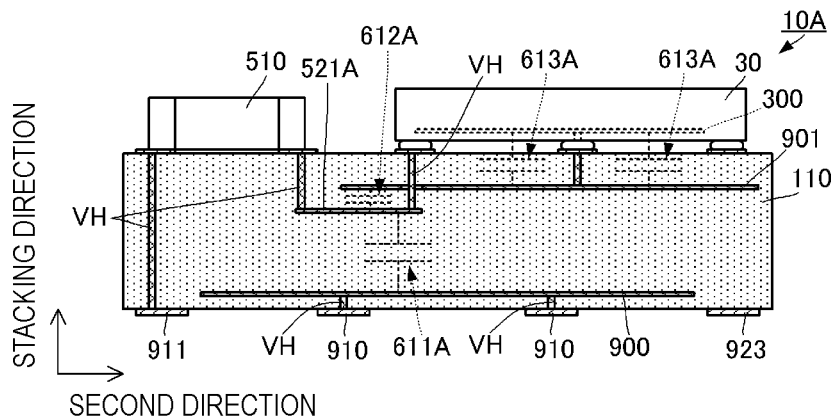
FIG. 4 is a cross-sectional side view illustrating the structure of a radio-frequency front end circuit according to a second preferred embodiment of the present invention.

Next, a radio-frequency front end circuit according to a second preferred embodiment of the present invention will be described with reference to the drawing. FIG. 4 is a cross-sectional side view illustrating the structure of the radio-frequency front end circuit according to the second preferred embodiment of the present invention. In FIG. 4, to make clear the structural characteristics of the radio-frequency front end circuit, horizontal and vertical dimensions are appropriately adjusted, and the positional relationship among the circuit elements (such as the mounted electronic components and the conductor patterns) is also appropriately adjusted.

As illustrated in FIG. 4, a radio-frequency front end circuit 10A according to the present preferred embodiment is different from the radio-frequency front end circuit 10 according to the first preferred embodiment in the shape of an inductor conductor pattern 521A and in a ground conductor 901. The configuration of the other components of the radio-frequency front end circuit 10A is the same or substantially the same as that of those of the radio-frequency front end circuit 10, and description of the same or similar components is omitted.

The inductor conductor pattern 521A preferably has a line shape and is located in the multilayer body 110 in the stacking direction.

The ground conductor 901 is preferably a rectangular or substantially rectangular conductor pattern and is located in the multilayer body 110 in the stacking direction. The ground conductor 901 is connected to the ground conductor 900 with an interlayer connection conductor (not illustrated) disposed therebetween. The ground conductor 901 is disposed closer to the upper surface in the stacking direction than the inductor conductor pattern 521A is.

The ground conductor 901 overlaps with at least a portion of the inductor conductor pattern 521A in the plan view of the multilayer body 110. With this configuration, a capacitor 612A is defined by the inductor conductor pattern 521A, the ground conductor 901, and a dielectric layer sandwiched therebetween. As in the first preferred embodiment, a capacitor 611A is defined by the inductor conductor pattern 521A, the ground conductor 900, and a dielectric layer sandwiched therebetween. In addition, in the configuration in the present preferred embodiment, capacitors 613A are defined by an internal wiring conductor 300 of the filter component 30 and the ground conductor 901. Accordingly, in the radio-frequency front end circuit 10A, the capacitor 61 in FIG. 1 is defined by the capacitors 611A, 612A, and 613A.

Accordingly, without increasing the planar area of the multilayer body 110, the parasitic capacitance is able to be increased, and thus, the capacitance of the capacitor 61 is able to be increased. That is, a frequency range leading to desired characteristics is able to be widened.

Figure 5:
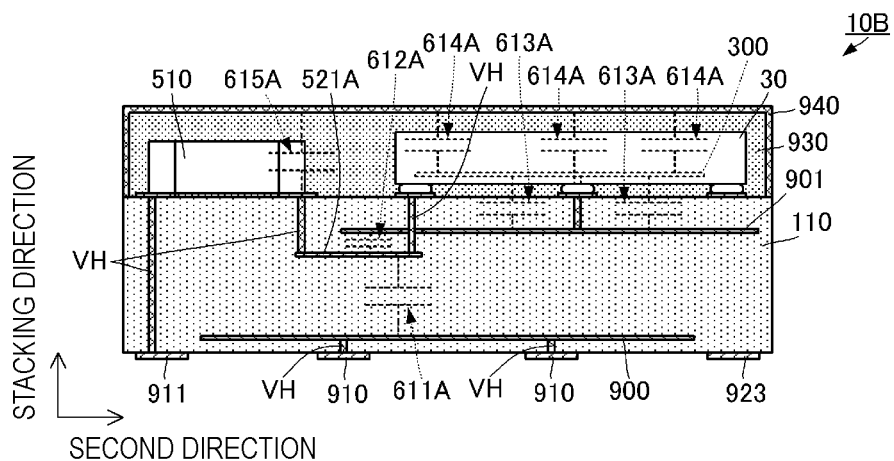
FIG. 5 is a cross-sectional side view illustrating the structure of a radio-frequency front end circuit according to a third preferred embodiment of the present invention.

Next, a radio-frequency front end circuit according to a third preferred embodiment of the present invention will be described with reference to the drawing. FIG. 5 is a cross-sectional side view illustrating the structure of the radio-frequency front end circuit according to the third preferred embodiment of the present invention. In FIG. 5, to make clear the structural characteristics of the radio-frequency front end circuit, horizontal and vertical dimensions are appropriately adjusted, and the positional relationship among the circuit elements (such as the mounted electronic components and the conductor patterns) is also appropriately adjusted.

As illustrated in FIG. 5, a radio-frequency front end circuit 10B according to the present preferred embodiment is different from the radio-frequency front end circuit 10A according to the second preferred embodiment in that a mold resin 930 and a shield conductor 940 are included. The configuration of the other components of the radio-frequency front end circuit 10B is the same or substantially the same as that of those of the radio-frequency front end circuit 10A, and description of the or similar same components is omitted.

The radio-frequency front end circuit 10B includes the multilayer body 110, the mold resin 930, and the shield conductor 940. The mold resin 930 is provided on the upper surface of the multilayer body 110. The mold resin 930 covers the entire or substantially the entire upper surface of the multilayer body 110 and, thus, covers all of the mounted electronic components. The shield conductor 940 covers the outer surface of the mold resin 930. The shield conductor 940 is connected to the ground conductors 900 and 901 of the multilayer body 110, but the connection is not illustrated.

With the configuration described above, capacitors 614A are defined by the internal wiring conductor 300 of the filter component 30 and the shield conductor 940. In addition, a capacitor 615A is defined by a mounted land conductor of the mounted inductor 510 and the shield conductor 940. Further, the external connection conductors of the mounted inductor 510 and the shield conductor 940 define capacitors, and these capacitors are also used for the capacitor 61 in FIG. 1. Accordingly, the capacitance of the capacitor 61 is able to be increased while preventing high-frequency coupling between an outside component (such as an external circuit) and the mounted electronic components mounted on the multilayer body 110. That is, a frequency range leading to desired characteristics is able to be widened.

Note that the radio-frequency front end circuit that demultiplexes the two types of communication signals in the low band and one type of communication signal in the high band has been described. However, the number of types of the communication signals in the low band may be 3 or larger and may also be 1.

Figure 6:
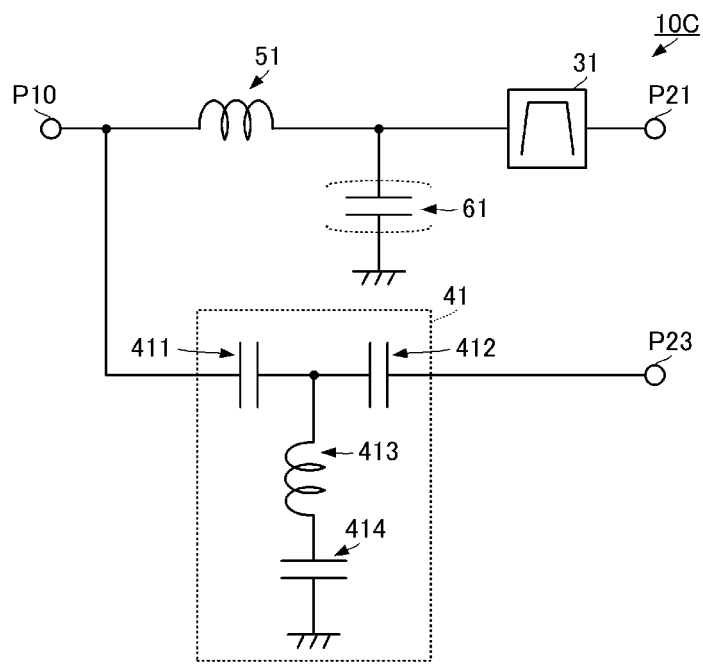
FIG. 6 is a circuit diagram of a radio-frequency front end circuit for one type of communication signal for each of a low band and a high band.

FIG. 6 is a circuit diagram of a radio-frequency front end circuit for one type of communication signal for each of a low band and a high band.

As illustrated in FIG. 6, a radio-frequency front end circuit 10C is different from the radio-frequency front end circuit 10 according to the first preferred embodiment in that the filter 32 and the output terminal P22 are omitted. The configuration of the other components of the radio-frequency front end circuit 10C is the same or substantially the same as that of those of the radio-frequency front end circuit 10, and description of the specific circuit configuration is omitted.

Also with the configuration described above, the same advantageous effects and operations as those of the above-described radio-frequency front end circuit 10 are able to be achieved in the radio-frequency front end circuit 10C by appropriately controlling the inductance of the matching inductor 51.

Figure 7:
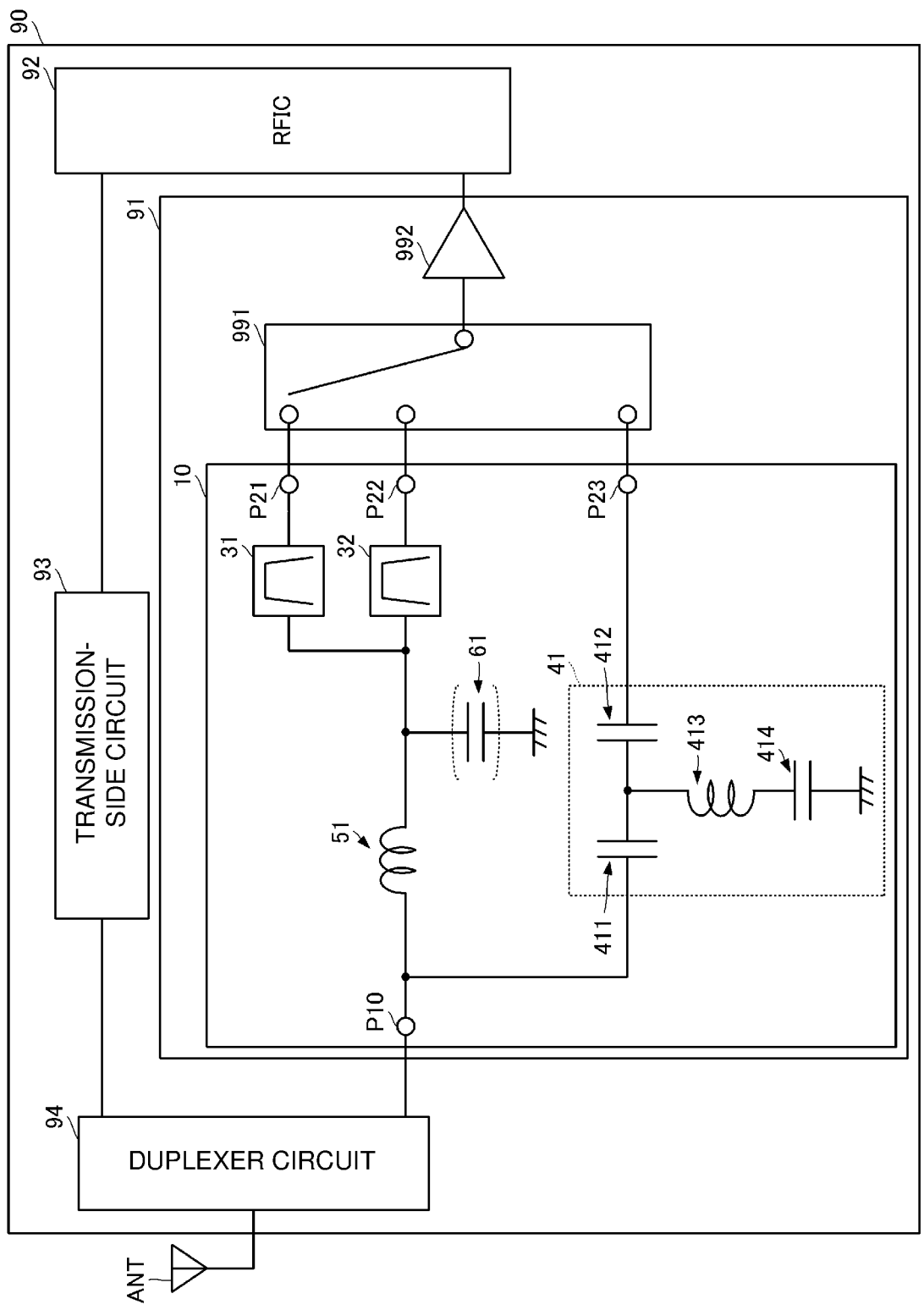
FIG. 7 is a functional block diagram of a communication device according to a preferred embodiment of the present invention including a respective radio-frequency front end circuit.

Each radio-frequency front end circuit described above is applicable to the following communication device. FIG. 7 is a functional block diagram of communication devices according to preferred embodiments of the present invention including respective radio-frequency front end circuits according to preferred embodiments of the present invention.

A communication device 90 includes a reception-side circuit 91, a RFIC 92, a transmission-side circuit 93, and a duplexer circuit 94. The reception-side circuit 91 includes the radio-frequency front end circuit 10, a switching circuit 991, and an amplifier 992. The reception-side circuit 91 corresponds to a "high-frequency signal processing circuit".

Terminals to be selected of the switching circuit 991 are respectively connected to the output terminals P21, P22, and P23 of the radio-frequency front end circuit 10. The common terminal of the switching circuit 991 is connected to the input end of the amplifier 992. The switching circuit 991 selectively performs connection to the common terminal on the terminals to be selected. A selected communication signal (reception signal) is thereby output to the amplifier 992.

The output end of the amplifier 992 is connected to the RFIC 92. The amplifier 992 is preferably a low noise amplifier (LNA), amplifies a communication signal (reception signal), and outputs the communication signal to the RFIC 92.

The transmission-side circuit 93 is connected between the RFIC 92 and the duplexer circuit 94. The transmission-side circuit 93 performs amplification processing, filtering processing, and other suitable processing on a communication signal (transmission signal) output from the RFIC 92 and outputs the communication signal to the duplexer circuit 94. The duplexer circuit 94 is connected to an antenna ANT, the transmission-side circuit 93, and the input terminal P10 of the radio-frequency front end circuit 10. The duplexer circuit 94 selectively connects the transmission-side circuit 93 or the input terminal P10 of the radio-frequency front end circuit 10 in the reception-side circuit 91 to the antenna ANT.

With the configuration as described above, a small communication device that reliably demultiplexes a communication signal (reception signal) is able to be provided.

Note that FIG. 7 illustrates a configuration in which the switching circuit 991 and the amplifier 992 are connected in this order to the output terminals P21, P22, and P23 of the radio-frequency front end circuit 10. However, amplifiers may be respectively connected to the output terminals P21, P22, and P23, and output from each amplifier may be connected to the RFIC 92 with a switching circuit disposed therebetween.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency front end circuit comprising:
   an input terminal;
   a first output terminal and a third output terminal;
   a first filter connected between the input terminal and the first output terminal and allowing a first communication signal to pass, the first filter being defined by an elastic wave filter;
   a third filter connected between the input terminal and the third output terminal and allowing a third communication signal to pass, the third communication signal being assigned, as a pass band, a frequency band higher than a pass band of the first communication signal, the third filter being defined by a high pass filter including a first inductor and a capacitor; and
   a second inductor located between the first filter and the input terminal and connected in series to the first filter and the input terminal.

2. The radio-frequency front end circuit according to claim 1, further comprising:
   a second output terminal; and
   a second filter connected between the input terminal and the second output terminal and allowing a second communication signal to pass, the second communication signal being assigned, as a pass band, a frequency band that is different from the pass band of the first communication signal and that is lower than the pass band of the third communication signal, the second filter being defined by an elastic wave filter, wherein
the second inductor is connected between a connection point between the first filter and the second filter and the input terminal.

3. The radio-frequency front end circuit according to claim 2, further comprising:
a multilayer body in which a predetermined conductor pattern is provided; wherein
the first filter, the second filter, at least a portion of the first inductor included in the third filter, and at least a portion of the capacitor included in the third filter are respectively mounted electronic components mounted on the multilayer body; and
the second inductor includes one of the mounted electronic components, a conductor pattern provided in the multilayer body, or both of the one of the mounted electronic components and the conductor pattern.

4. The radio-frequency front end circuit according to claim 3, wherein the conductor pattern included in the second inductor is capacitively coupled to a ground conductor provided inside the multilayer body.

5. The radio-frequency front end circuit according to claim 4, wherein
the mounted electronic components are mounted on a surface of the multilayer body;
a shield conductor that at least covers the one of mounted electronic components included in the second inductor and that is connected to the ground conductor is disposed on the surface of the multilayer body; and
the mounted electronic component included in the second inductor and the shield conductor are capacitively coupled.

6. A high-frequency signal processing circuit comprising:
the radio-frequency front end circuit according to claim 1;
a switching circuit that performs selection on a plurality of output terminals that include at least the first output terminal and the third output terminal; and
an amplifier connected to the switching circuit.

7. The high-frequency signal processing circuit according to claim 6, further comprising:
a second output terminal; and
a second filter connected between the input terminal and the second output terminal and allowing a second communication signal to pass, the second communication signal being assigned, as a pass band, a frequency band that is different from the pass band of the first communication signal and that is lower than the pass band of the third communication signal, the second filter being defined by an elastic wave filter; wherein
the second inductor is connected between a connection point between the first filter and the second filter and the input terminal.

8. The high-frequency signal processing circuit according to claim 7, further comprising:
a multilayer body in which a predetermined conductor pattern is provided; wherein
the first filter, the second filter, at least a portion of the first inductor included in the third filter, and at least a portion of the capacitor included in the third filter are respectively mounted electronic components mounted on the multilayer body; and
the second inductor includes one of the mounted electronic components, a conductor pattern provided in the multilayer body, or both of the one of the mounted electronic components and the conductor pattern.

9. The high-frequency signal processing circuit according to claim 8, wherein the conductor pattern included in the second inductor is capacitively coupled to a ground conductor provided inside the multilayer body.

10. The high-frequency signal processing circuit according to claim 9, wherein
the mounted electronic components are mounted on a surface of the multilayer body;
a shield conductor that at least covers the one of mounted electronic components included in the second inductor and that is connected to the ground conductor is disposed on the surface of the multilayer body; and
the mounted electronic component included in the second inductor and the shield conductor are capacitively coupled.

11. A communication device comprising:
the high-frequency signal processing circuit according to claim 6; and
a RFIC connected to the high-frequency signal processing circuit.

12. The communication device according to claim 11, further comprising:
a second output terminal; and
a second filter connected between the input terminal and the second output terminal and allowing a second communication signal to pass, the second communication signal being assigned, as a pass band, a frequency band that is different from the pass band of the first communication signal and that is lower than the pass band of the third communication signal, the second filter being defined by an elastic wave filter; wherein
the second inductor is connected between a connection point between the first filter and the second filter and the input terminal.

13. The communication device according to claim 12, further comprising:
a multilayer body in which a predetermined conductor pattern is provided; wherein
the first filter, the second filter, at least a portion of the first inductor included in the third filter, and at least a portion of the capacitor included in the third filter are respectively mounted electronic components mounted on the multilayer body; and
the second inductor includes one of the mounted electronic components, a conductor pattern provided in the multilayer body, or both of the one of the mounted electronic components and the conductor pattern.

14. The communication device according to claim 13, wherein the conductor pattern included in the second inductor is capacitively coupled to a ground conductor provided inside the multilayer body.

15. The communication device according to claim 14, wherein
the mounted electronic components are mounted on a surface of the multilayer body;
a shield conductor that at least covers the one of mounted electronic components included in the second inductor and that is connected to the ground conductor is disposed on the surface of the multilayer body; and
the mounted electronic component included in the second inductor and the shield conductor are capacitively coupled.

* * * * *